United States Patent
Liu et al.

(10) Patent No.: US 9,570,285 B2
(45) Date of Patent: Feb. 14, 2017

(54) CLEANING COMPOSITION AND METHODS THEREOF

(71) Applicant: Taiwan Semiconductor Manufacturing Company, Ltd., Hsin-Chu (TW)

(72) Inventors: Chen-Yu Liu, Kaohsiung (TW); Ching-Yu Chang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/690,024

(22) Filed: Apr. 17, 2015

(65) Prior Publication Data
US 2016/0307746 A1   Oct. 20, 2016

(51) Int. Cl.
 *H01L 21/311* (2006.01)
 *H01L 21/02* (2006.01)
 *H01L 21/033* (2006.01)

(52) U.S. Cl.
 CPC ..... *H01L 21/0206* (2013.01); *H01L 21/02123* (2013.01); *H01L 21/02282* (2013.01); *H01L 21/0332* (2013.01); *H01L 21/31144* (2013.01)

(58) Field of Classification Search
 CPC .......... H01L 21/0206; H01L 21/02123; H01L 21/02282; H01L 21/0332; H01L 21/31144
 USPC ............................... 438/689–694; 216/37, 67
 See application file for complete search history.

(56) References Cited

U.S. PATENT DOCUMENTS

| | | | | |
|---|---|---|---|---|
| 5,134,962 | A * | 8/1992 | Amada | H01L 21/6715 118/320 |
| 7,811,936 | B2 * | 10/2010 | Takigawa | H01L 21/02063 257/E21.228 |
| 8,216,767 | B2 | 7/2012 | Wang et al. | |
| 8,323,870 | B2 | 12/2012 | Lee et al. | |
| 8,580,117 | B2 | 11/2013 | Kao et al. | |
| 8,658,344 | B2 | 2/2014 | Wang et al. | |
| 8,715,919 | B2 | 5/2014 | Chang et al. | |
| 8,741,551 | B2 | 6/2014 | Wu et al. | |
| 2001/0038976 | A1 * | 11/2001 | Tanabe | G03F 7/425 430/325 |

(Continued)

*Primary Examiner* — Duy Deo
*Assistant Examiner* — Maki Angadi
(74) *Attorney, Agent, or Firm* — Haynes and Boone, LLP

(57) ABSTRACT

Provided is a cleaning solution and its applications. The cleaning solution comprises a mixture of a basic chemical compound and a solvent solution. In some embodiments, the basic chemical compound is tetramethylammonium hydroxide (TMAH) and the solvent solution includes a solution of water and at least one of propylene glycol ethyl ether (PGEE), propylene glycol monomethylether (PGME), and propylene glycol monomethylether acetate (PGMEA). The cleaning solution is effective in removing silicon-containing material off a surface of a system or a surface of a semiconductor substrate. In some embodiments, the system comprises a pipeline for delivering the silicon-containing material in semiconductor spin-coating processes. In some embodiments, the system comprises a drain for collecting waste fluid in semiconductor spin-coating processes. In some embodiments, the silicon-containing material has a first pH value, the cleaning solution has a second pH value, and the silicon-containing material is unstable at the second pH value.

20 Claims, 12 Drawing Sheets

(56) References Cited

U.S. PATENT DOCUMENTS

| | | | |
|---|---|---|---|
| 2007/0084483 A1* | 4/2007 | Freer | B08B 3/00 |
| | | | 134/6 |
| 2013/0323641 A1 | 12/2013 | Chang | |
| 2014/0011133 A1 | 1/2014 | Liu et al. | |
| 2014/0017615 A1 | 1/2014 | Chang | |
| 2014/0017616 A1 | 1/2014 | Chang | |
| 2014/0065843 A1 | 3/2014 | Chang et al. | |
| 2014/0117563 A1 | 5/2014 | Yu et al. | |
| 2014/0120459 A1 | 5/2014 | Liu et al. | |
| 2014/0186773 A1 | 7/2014 | Chang | |
| 2014/0255850 A1 | 9/2014 | Chang et al. | |
| 2014/0272709 A1 | 9/2014 | Liu et al. | |
| 2014/0272726 A1 | 9/2014 | Chang | |
| 2014/0273521 A1 | 9/2014 | Wu et al. | |

* cited by examiner

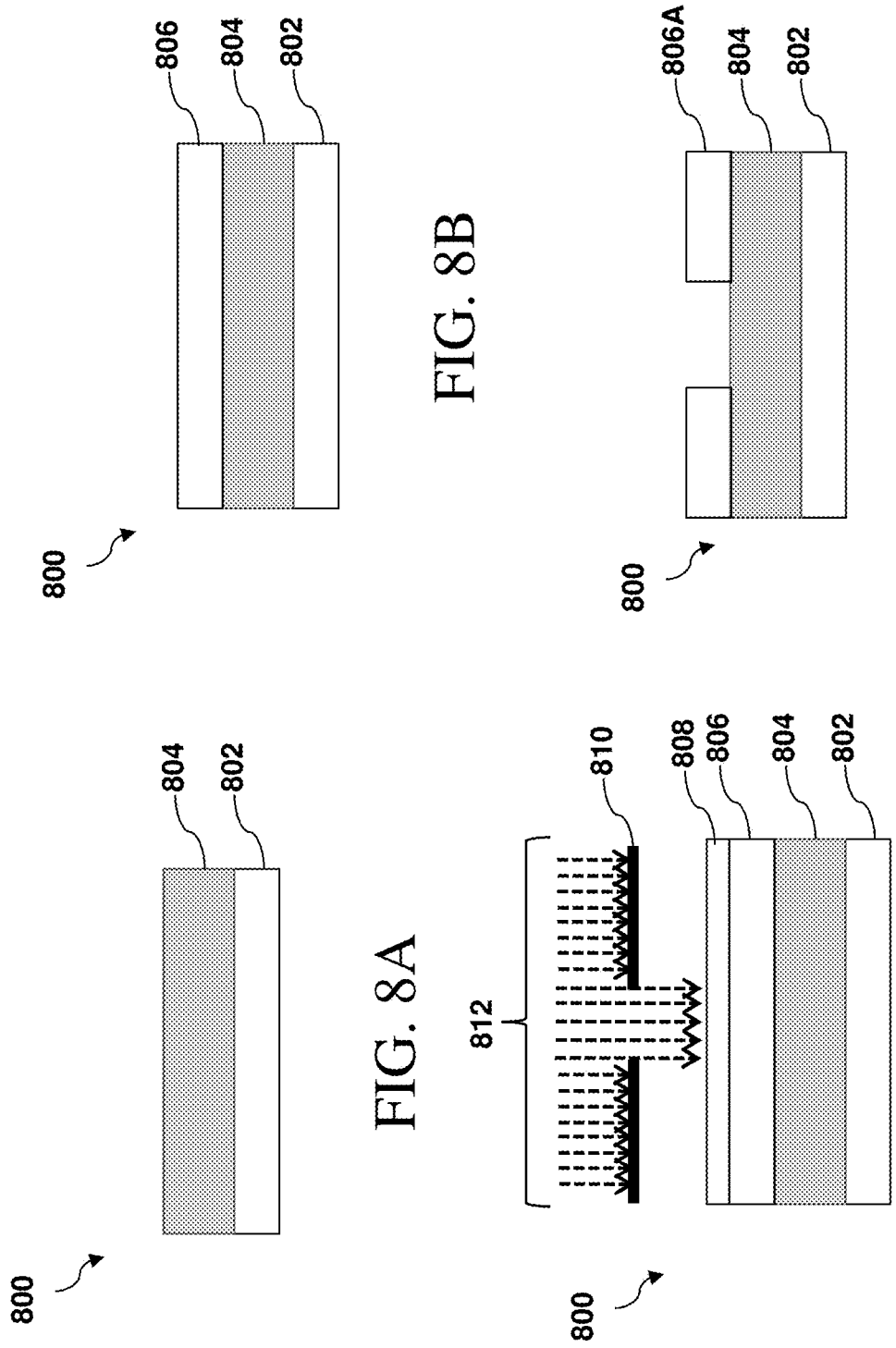

CLEANING COMPOSITION AND METHODS THEREOF

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

As merely one example, semiconductor lithography processes may be used to optically transfer patterns (e.g., using a photomask or reticle) onto a substrate. For instance, in various lithography processes, a resist film is spin-coated onto a surface of a wafer and is subsequently exposed and developed to form a pattern that can be transferred to the wafer (e.g., by a subsequent etching process). With the continued scaling down of IC dimensions, there has been a demand for a reduction in resist film thickness as well as resist materials offering improved reflectivity control, substrate planarization, adhesion promotion, chemical matching, and protection from contamination. Accordingly, various new resist materials and processes have been developed. For example, some lithography processes may employ a silicon-containing resist over a bottom anti-reflective coating (BARC) layer to reduce resist film thickness. In addition, some lithography processes use a tri-layer stack that includes a resist over a silicon-containing BARC layer over an organic underlayer. However, these approaches present new challenges.

For example, the silicon-containing material used in such processes may form a hardened gel by forming cros slinks therein, for example, when solvents of the silicon-containing material dry out. Moreover, the equipment that handles such material must undergo frequent cleaning processes to avoid becoming clogged or otherwise contaminated, and to avoid defect formation on production wafers processed by such equipment. Thus, existing techniques have not proved entirely satisfactory in all respects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 8A-8G illustrate a substrate at various stages of the semiconductor manufacturing process of FIGS. 7A and 7B, in accordance with some embodiments.

DETAILED DESCRIPTION

Figure 1:
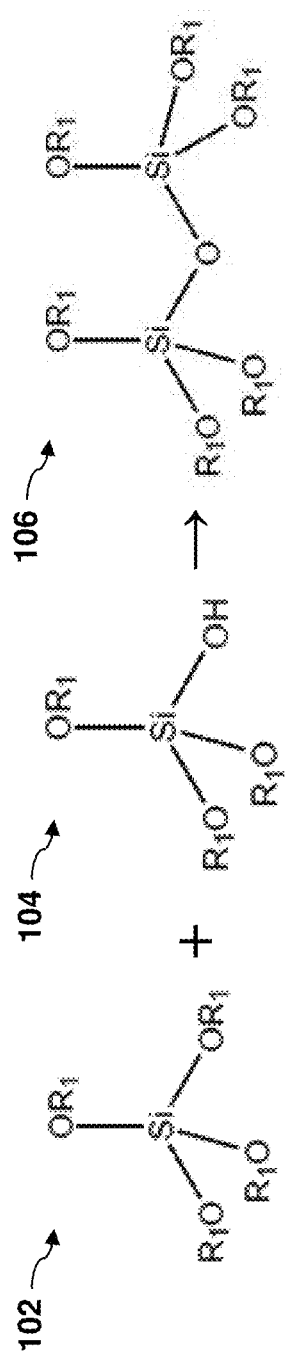
FIG. 1 illustrates a silicon-containing material cross-linking reaction, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to cleaning solution compositions and their applications. The cleaning solution can be used to clean semiconductor fabrication equipment, especially the apparatuses for delivering, dispensing, and collecting silicon-containing material in lithography spin-coating processes. The cleaning solution can also be used to remove a silicon-containing hard mask after the hard mask has been used in etching processes.

In a typical lithography patterning process, a resist layer is formed over a hard mask layer and is patterned with an IC design layout. An etching process is subsequently followed, which etches the hard mask layer using the patterned resist layer as an etch mask, thereby transferring the pattern to the hard mask layer. Further steps are performed to transfer the pattern to a substrate. As IC dimensions continue to scale down, resist layers have also scaled down, presenting new challenges. In some examples, the resist pattern has become narrower and taller, where such high aspect ratios cause the resist pattern to easily collapse. Additionally, as resist layer thicknesses have decreased, there may not be a sufficient thickness of resist to adequately transfer a resist pattern to an underlying layer. In some aspects, this may be due to an insufficient etching resistance of the resist layer.

Silicon-containing materials, implemented in bilayer and multilayer (e.g., tri-layer) processes, have been used in an effort to successfully implement thin imaging layers which overcome one or more of the problems noted above (e.g., pattern collapse, insufficient etching resistance, etc.). In the bilayer approach, a silicon-containing resist layer may be formed over a BARC layer. The silicon-containing resist has a higher etch resistance than conventional resists and therefore needs not be as thick as conventional resists. In the multilayer or tri-layer approach, a thin resist layer may be formed over a silicon-containing BARC (or hard mask) layer which is in turn formed over an underlying BARC layer. In some embodiments, the silicon-containing BARC layer may be formed over an organic underlayer such as a spin-on carbon underlayer. The thin resist layer may be used to pattern the silicon-containing BARC layer, which is then used to pattern the underlying BARC layer. In various embodiments, all three layers (i.e., resist, silicon-containing BARC, and underlying BARC) may be formed using a spin-coating process or a chemical vapor deposition (CVD) process.

Both the bilayer and multilayer approach take advantage of the high density of the silicon-containing materials used therein, which is a result of a cross-linking capability of their constituent monomers and molecules. With reference to the example of FIG. 1, silicon-containing materials used in the bilayer or multilayer processes described above may include monomers such as monomer 102 which includes Si bonded to $OR_1$ groups, where O is oxygen and $R_1$ includes an organic substituent such as methyl, ethyl, or aryl. Monomers of the silicon-containing material (e.g., the monomer 102) are very unstable and constituent $OR_1$ groups may readily hydrolyze, resulting in monomers such as monomer 104 where a hydroxyl group is formed in place of an $OR_1$ group. Monomers 102, 104 may then react to form a cross-linked structure such as cross-linked structure 106. In various examples, the hydrolysis and cross-linking described above will readily occur when solvents of the silicon-containing materials dry out.

Figure 2B:
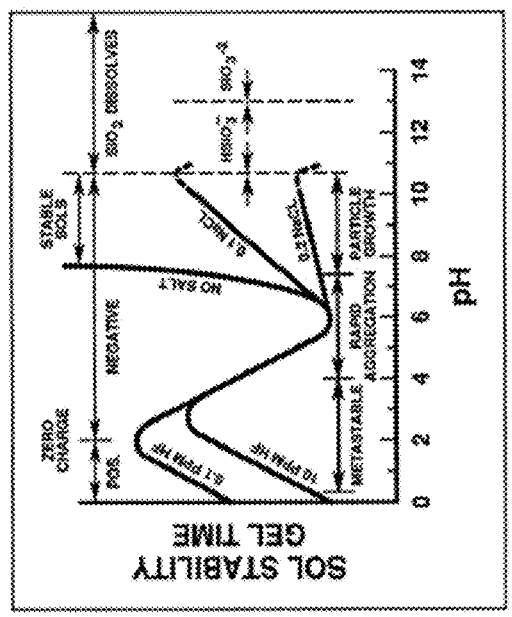
FIG. 2B illustrates the effects of pH in the colloidal silica-water system, in accordance with various embodiments.
Figure 2A:
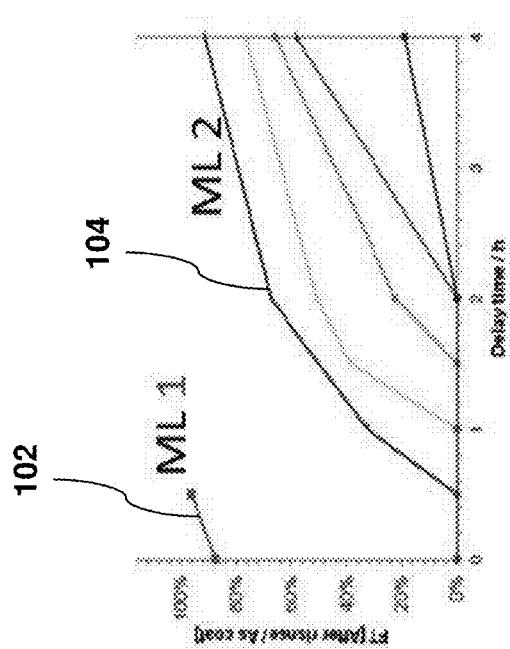
FIG. 2A illustrates an ineffectiveness of using existing cleaning solutions to remove a silicon-containing hard mask material.

However, the same property that makes these silicon-containing materials desirable for lithography processes also presents a challenge to lithography equipment handling these materials. For example, cross-linked silicon-containing material may coat surfaces of containers that store such silicon-containing materials, as well as pipelines and delivery apparatuses that deliver the materials in liquid form (e.g., during spin-coating processes), and collection apparatuses that collect waste materials (e.g., during spin-coating processes). In order to avoid defect formation on production wafers processed by such contaminated equipment, the equipment needs to be regularly and effectively cleaned to remove the silicon-containing material from the surfaces of the processing equipment. To illustrate the difficulty in removing such silicon-containing material (e.g., from surfaces of lithography equipment), FIG. 2A illustrates film thickness (FT) versus delay time (in hours) for a plurality of silicon-containing hard mask materials. "Delay time", as used herein, refers to an amount of time that elapses prior to application of a rinsing/cleaning agent used to remove the silicon-containing material. For the example of FIG. 2A, the rinsing/cleaning agent includes a traditional cleaning solvent, such as OK73 (70% Propylene glycol monomethylether+30% Propylene glycol monomethylether acetate). By way of example, two particular silicon-containing hard mask materials, ML1 and ML2, are labeled in FIG. 2A. For the case of ML1, curve 102 shows that the ML1 material layer will retain over 80% of its as-deposited thickness even when OK73 is immediately applied (i.e., zero delay time) and will become nearly impossible to remove by OK73 after about half an hour delay. For the case of ML2, curve 104 shows that the ML2 material layer is easier to remove than the ML1 material layer, but becomes increasingly difficult to remove by OK73 as time passes. Consequently, the lithography equipment handling these materials may become clogged as the materials harden. Furthermore, the material may form particles that contaminate wafers during various processing stages.

It is therefore an objective of the present disclosure to provide new cleaning compositions that can effectively remove such silicon-containing materials (e.g., from lithography equipment surfaces). In the various embodiments described herein, formation of a hardened silicon-containing material layer may occur in accordance with a sol-gel process, where a 'sol' (i.e., solution, such as silicon-containing liquid 310) evolves into a gel, for example, when solvents of the silicon-containing material dry out. By way of example, and with reference to FIG. 2B, illustrated therein is a graph showing the effects of pH in the colloidal silica-water system. FIG. 2B is taken from R. K. Iler, The Chemistry of Silica, Wiley, New York, 1979, the contents of which are herein incorporated by reference. As illustrated in FIG. 2B, at a pH value of about 8-10, condensation increases, leading to the formation of a stable gel or non-dissolving polymer. At a pH value greater than about 10, a hydrolysis reaction is preferred, and an increased negative charge (e.g., provided by hydroxide ions of the cleaning solution) retards the formation of gel or particles. Thus, by way of example, a hardened silicon-containing material, as described herein, may become unstable (and thus dissolve) at pH values greater than about 10 due to the presence of the increased negative charge.

Figure 3A:
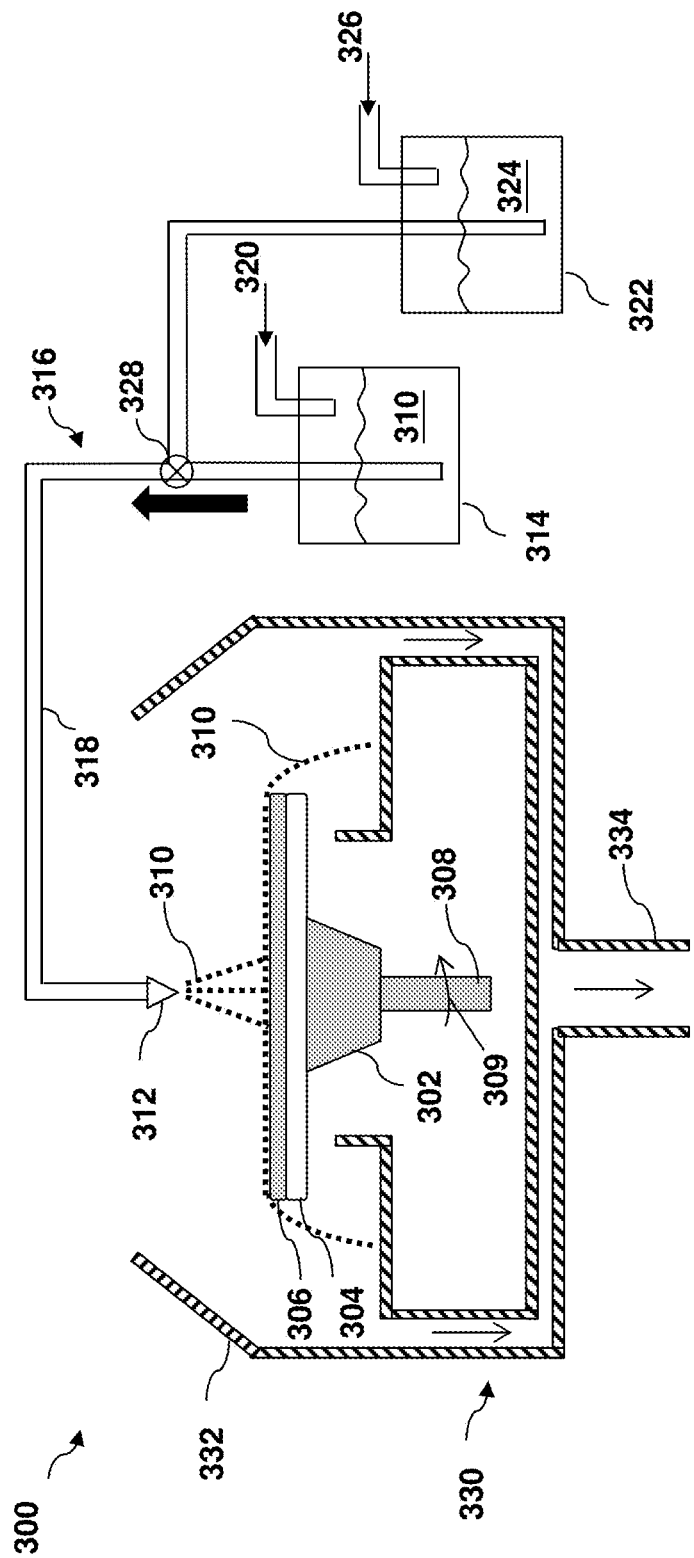
FIG. 3A illustrates a semiconductor system that may benefit from various aspects of the present disclosure.

Now, referring to FIG. 3A, shown therein is a semiconductor spin-coating system 300 that may benefit from various aspects of the present disclosure. As shown, the system 300 includes a substrate stage 302 designed to retain a substrate 304 to be patterned. The substrate 304 is coated with a silicon-containing material layer 306, for example, as part of a bilayer or multilayer lithography stack as described above. The substrate stage 302 is operable to spin such that the substrate 304 secured thereon is spun accordingly during the spin-coating process. The substrate stage 302 includes a mechanism, such as vacuum suction mechanism, electrostatic chucking mechanism, or other suitable mechanism, to secure the substrate 304. In the present embodiments, the substrate 304 is a semiconductor wafer, such as a silicon wafer. In some embodiments, the substrate 304 may include various layers, including conductive or insulating layers formed on a semiconductor substrate. The substrate 304 may include various doping configurations depending on design requirements as is known in the art. The substrate 304 may also include other semiconductors such as germanium, silicon carbide (SiC), silicon germanium (SiGe), or diamond. Alternatively, the substrate 304 may include a compound semiconductor and/or an alloy semiconductor. Further, the substrate 304 may optionally include an epitaxial layer (epi-layer), may be strained for performance enhancement, may include a silicon-on-insulator (SOI) structure, and/or have other suitable enhancement features.

The system 300 further includes a drive shaft 308 coupled to the substrate stage 302 and that is operable to drive the substrate stage 302 and the substrate 304 secured thereon in various modes. In particular, the drive shaft 308 may be coupled to a motor that serves to spin the drive shaft 308, as indicated by arrow 309, and thereby rotate the substrate stage 302 and the substrate 304 at various spin speeds in accordance with various modes of operation (e.g., such as coating and rinsing). In some embodiments, the drive shaft 308 is further coupled to an elevation module that serves to move the substrate stage 302 and the substrate 304 along a vertical direction so that the substrate 304 may be positioned at a lower or higher level.

In various examples, a silicon-containing liquid 310 is dispensed through a nozzle 312 over the substrate 304 while it is spun. As solvents in the liquid 310 dry out, the silicon-containing material layer 306 is formed. The silicon-containing liquid 310 is stored in a container 314 and is delivered to the nozzle 312 through a delivery apparatus 316 that includes a pipeline 318. In the embodiment as shown, a pressurized gas 320, such as nitrogen, may be introduced into the container 314 to force the liquid 310 into the delivery apparatus 316. The system 300 further includes a container 322 that holds a cleaning solution 324 which will be described in more details below. In the embodiment as shown, a pressurized gas 326, such as nitrogen, may be introduced into the container 322 to force the cleaning solution 324 into the delivery apparatus 316. In various embodiments, the delivery apparatus 316 includes a three-way valve 328 that alternately directs the silicon-containing liquid 310 to the pipeline 318 (e.g., during spin-coating cycles) or directs the cleaning solution 324 to the pipeline 318 (e.g., during cleaning cycles). In various embodiments, the delivery apparatus 316 may alternatively use a pump or other mechanism in delivering the liquid 310 and the cleaning solution 324 to the pipeline 318 of the delivery apparatus 316.

The system 300 further includes a waste collection apparatus 330 that includes a cup 332 and a drain 334. The cup 332 is configured to at least partially enclose the substrate stage 302, as shown in FIG. 3A, to effectively catch the liquid 310 spun off from the substrate 304 (e.g., during the spin-coating process). In some embodiments, the cup 332 is designed to have a cylindrical structure. In some embodiments, the cup 332 is integrated with the drain 334 such that the liquid captured by the cup 332 is sent out through the drain 334 for further processing.

Figure 3B:
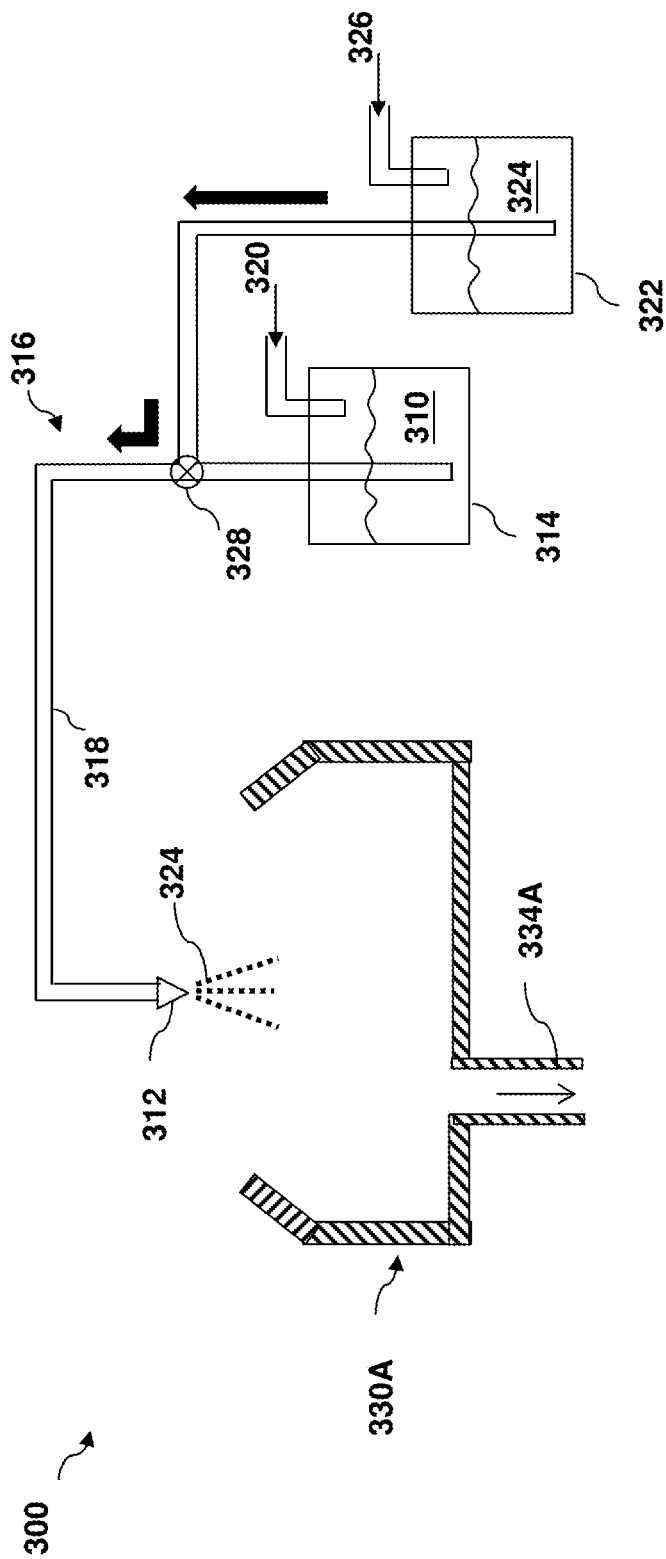
FIGS. 3B and 3C illustrate components of the system of FIG. 3A being cleaned by a cleaning solution, according to various aspects of the present disclosure.
Figure 3C:
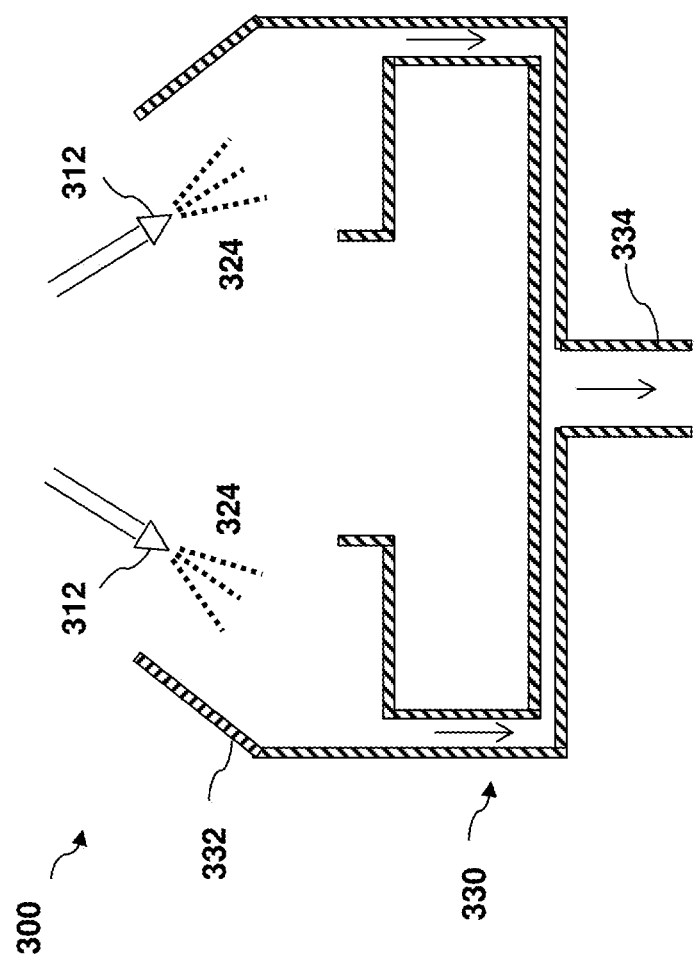

As described above, the various components of the delivery apparatus 316 and the waste collection apparatus 330 could become clogged by the silicon-containing material 310 as it deposits onto the surfaces of the various components. Hence, the system 300 periodically undergoes cleaning cycles to remove such deposits. With reference to the example of FIG. 3B, illustrated therein are some components of the system 300 being cleaned in one such cleaning cycle. In the illustration of FIG. 3B, the substrate 304 including the silicon-containing material layer 306 have been removed to undergo further processing, such as exposing and developing, which are not illustrated here. The nozzle 312 has been repositioned to direct any fluid to a waste collection apparatus 330A including a drain 334A. Further, the three-way valve 328 is configured to switch off flow of the liquid 310 and switch on flow of the cleaning solution 324. The pressurized gas 326, such as nitrogen, is introduced to the container 322 to force the cleaning solution 324 into the delivery apparatus 316. The cleaning solution 324 flushes (i.e., cleans) surfaces of the delivery apparatus 316 including the pipeline 318 and the nozzle 312, and any waste is collected by the waste collection apparatus 330A and is sent out through the drain 334A. It is noted that the various components may be cleaned without being taken out of the spin-coating system 300, thereby reducing the system's off-line time. With reference to FIG. 3C, illustrated therein is a portion of the system 300, including the waste collection apparatus 330 being cleaned using the cleaning solution 324. In particular, as shown in the embodiment of FIG. 3C, the cleaning solution 324 is sprayed onto the inner surfaces of the cup 332, for example by appropriately repositioning the nozzle 312 into any of a plurality of positions so as to spray an entirety of the interior surfaces of the cup 332. In various embodiments, any waste is collected into the drain 334.

Figure 4:
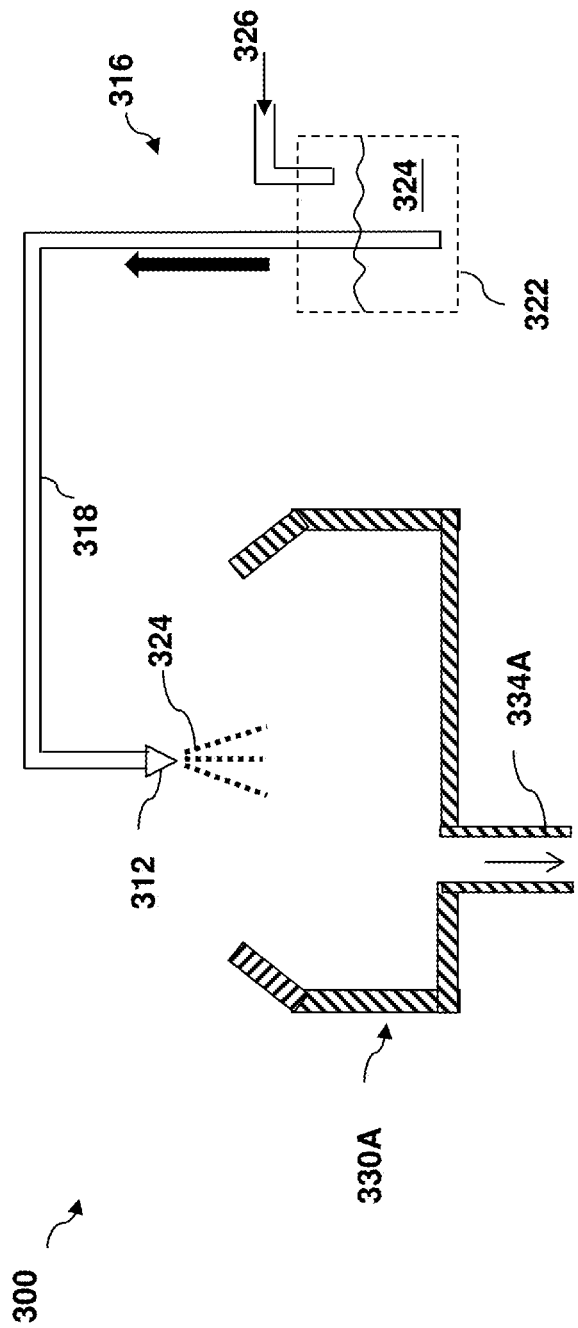
FIG. 4 illustrates an alternative method of cleaning components of the system of FIG. 3A, according to various aspects of the present disclosure.

FIG. 4 shows an alternative embodiment of the delivery apparatus 316 and the cleaning thereof. Referring to FIG. 4, the delivery apparatus 316 does not use a three-way valve. Instead, the containers 314 and 322 are switchable and are selectively installed. For example, during spin-coating cycles, the container 314 is used; during cleaning cycles, the container 322 replaces the container 314. This simplifies the delivery apparatus 316 and makes it easier to clean. Other embodiments of applying the cleaning solution 324 are possible. For example, instead of using pressurized gas, a pump can be used to extract the cleaning solution 324 from the container 322 into the delivery apparatus 316.

In various embodiments, the cleaning solution 324 is a mixture of a basic chemical compound and a solvent, such as an organic solvent. The basic chemical compound is dissolved into the solvent, resulting in a basic cleaning solution 324 that is rich in hydroxide ions. In various embodiments, the basic cleaning solution 324 has a high pH value (e.g., greater than about 10). In some embodiments, Si—O bonds, which form the cross-linked structure 106 (FIG. 1), are not stable at high pH values (e.g., at pH values greater than about 10). Thus, the basic cleaning solution 324 may be used to break down the Si—O bonds of the silicon-containing material, dissolve the silicon-containing material, and effectively clean the system 300. In at least some embodiments, a "silicon-containing material layer" may include a layer having a silicon (Si) concentration greater than about 10%.

In an embodiment, the basic chemical compound is tetramethylammonium hydroxide (TMAH) and the solvent is a glycol ether such as propylene glycol ethyl ether (PGEE). In some embodiments, the solvent includes 70% by weight propylene glycol monomethylether (PGME) and 30% by weight propylene glycol monomethylether acetate (PGMEA), such as the solvent OK73, discussed above. In some embodiments, the solvent includes a solution of a solvent and water. For example, in various cases, the solvent solution includes a PGEE/water ratio of about 90/10, 97/3, or 99/1. In some embodiments including a solution of a solvent and water, the water concentration is at least 5% or greater. Thus, in some examples including a solution of PGEE and water, the PGEE/water ratio may be around 95/5. Such a solvent solution may then be mixed with the basic chemical compound (e.g., TMAH) to form the cleaning solution 324. In various embodiments, the basic chemical compound may include a 0.24% by weight TMAH solution, a 0.07% by weight TMAH solution, or a 0.02% by weight TMAH solution. In some embodiments, the basic chemical compound includes a 0.20% by weight (or greater) TMAH solution. Other chemicals, such as surfactants and/or additives, may be added to further adjust the pH value and viscosity of the cleaning solution 324.

Figure 5:
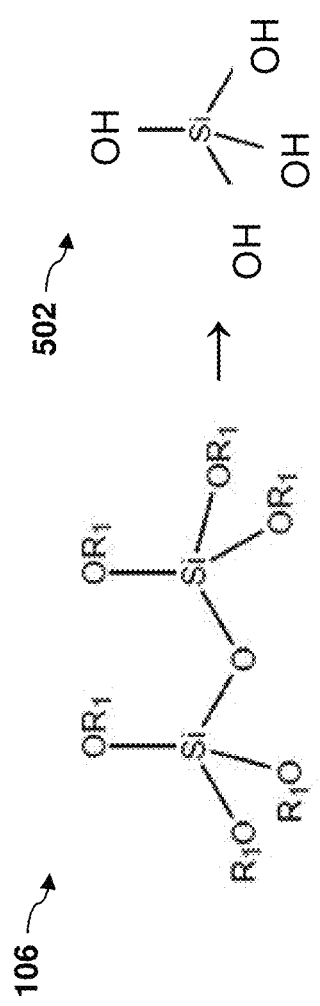
FIG. 5 illustrates a reaction where bonds in a cross-linked silicon-containing material are broken, in accordance with some embodiments.

For purposes of illustration, in various embodiments and with reference to FIG. 5, unstable Si—O bonds (e.g., at the high pH values of the cleaning solution 324) break apart, and hydroxide ions (OH⁻) of the cleaning solution 324 are effective in replacing the oxygen of the broken Si—O bonds. In various applications, the cleaning solution 324 can be used to dissolve hardened silicon-containing material 310 and remove it from the surfaces of the delivery apparatus 316, the waste collection apparatus 330, and/or other surfaces of the system 300. In at least some of the embodiments described herein, the cleaning solution 324 has a concentration of hydroxide ions (OH⁻) in a range of between about 0.01% and about 10%.

Figure 6:
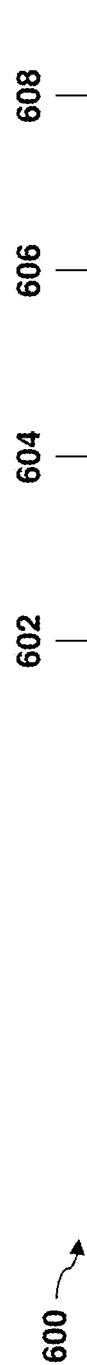
FIG. 6 illustrates an effectiveness of various embodiments of a cleaning solution to remove a silicon-containing hard mask material.

Referring now to FIG. 6, a table 600 illustrated therein shows the effectiveness of some embodiments of the cleaning solution 324 in removing the silicon-containing material 310 from a surface of the system 300. In the embodiments of FIG. 6, the basic chemical compound is TMAH, and the solvent is PGEE or a solution of PGEE and water. The data in the table 600 was collected by spin-coating the silicon-containing material 310 over a substrate (e.g., the substrate 304) and letting the silicon-containing material 310 dry out at room temperature. An initial film thickness (FT) was measured, and the substrate 304 including a film of the silicon-containing material (e.g., the silicon-containing material layer 306) was then submerged into a container holding an embodiment of the cleaning solution 324 for a plurality of dipping times (e.g., five minutes, two hours, and 12 hours). The thickness of the film was measured again after dipping the substrate 304 into the cleaning solution 324. It is noted that the data of the table 600 may also be used to calculate an etch rate for various embodiments of the cleaning solution 324.

As shown in FIG. 6, the table 600 shows the initial FT 602 (425 Angstroms, also represented as 100% FT), and the measured FT after a five minute cleaning solution dip 604, after a two hour cleaning solution dip 606, and after a 12 hour cleaning solution dip 608. The experiment illustrated in FIG. 6 was performed for a plurality of embodiments of the cleaning solution 324. In a first embodiment 610, the cleaning solution 324 includes only PGEE. In a second embodiment 612, the cleaning solution 324 includes a 0.02% by weight TMAH solution mixed with a solvent solution including a PGEE/water ratio of about 99/1. In a third embodiment 614, the cleaning solution 324 includes a 0.07% by weight TMAH solution mixed with a solvent solution including a PGEE/water ratio of about 97/3. In a fourth embodiment 616, the cleaning solution 324 includes a 0.24% by weight TMAH solution mixed with a solvent solution including a PGEE/water ratio of about 90/10. The efficacy of the various embodiments 610, 612, 614, 616 is evident by the data of the table 600. For the case of the first embodiment 610, there is no measurable change in thickness of the film until after 12 hours in the PGEE-only cleaning solution 324, where the measured thickness reduced to 415 Angstroms (~97% of the initial FT). For the example of the second embodiment 612, there is no measurable change in thickness of the film until after two hours in the 0.02% TMAH, PGEE/water ratio ~99/1 cleaning solution 324, where the measured thickness reduced to 415 Angstroms (~97% of the initial FT). The measured thickness did not reduce further, as compared to the two hour measurement, after 12 hours in the second embodiment 612 of the cleaning solution 324. For the example of the third embodiment 614, there is no measurable change in thickness of the film until after two hours in the 0.07% TMAH, PGEE/water ratio ~97/3 cleaning solution 324, where the measured thickness reduced to 395 Angstroms (~93% of the initial FT). After 12 hours in the third embodiment 614 of the cleaning solution 324, the measured thickness was further reduced to 350 Angstroms (~82% of the initial FT). For the example of the fourth embodiment 616, there is a rapid change in thickness of the film until after five minutes in the 0.24% TMAH, PGEE/water ratio ~90/10 cleaning solution 324, where the measured thickness reduced to 35 Angstroms (~8% of the initial FT). After two hours (and again at 12 hours) in the fourth embodiment 616 of the cleaning solution 324, the measured thickness was further reduced to less than 20 Angstroms (~0% of the initial FT). In some embodiments, a reduction of the FT to less than 20 Angstroms is considered to be a complete removal of the silicon-containing material 310.

Figure 7A:
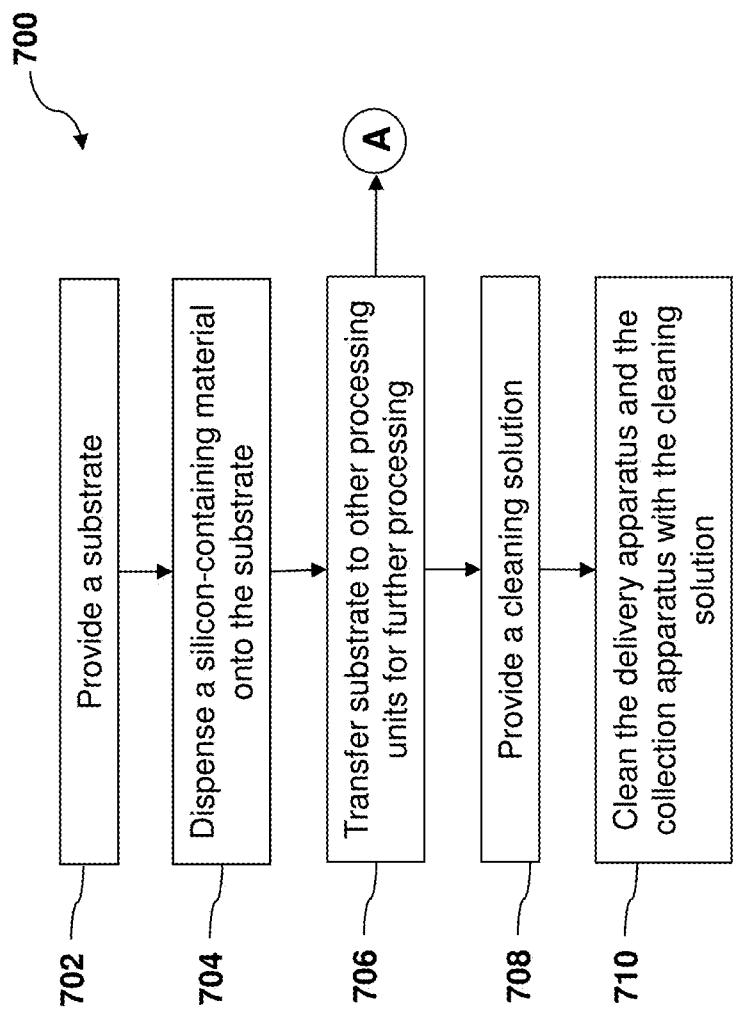
FIGS. 7A and 7B illustrate a flow chart of a semiconductor manufacturing process, in accordance with some embodiments.
Figure 7B:
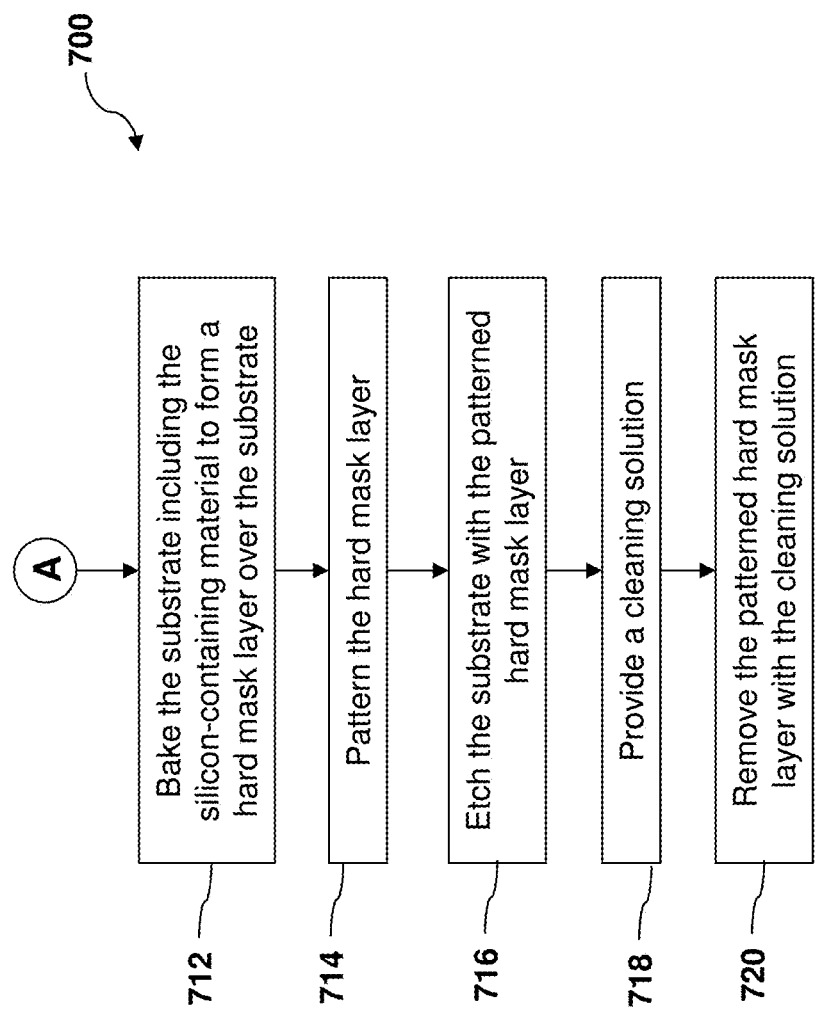

FIGS. 7A and 7B show a flow chart of a semiconductor manufacturing method 700, illustrating some exemplary applications of various embodiments of the cleaning solution 324. It is noted that these are merely examples and do not limit where and how the cleaning solution 324 is used. Additional steps may also be provided before, during, and after the method 700, and some steps described can be replaced, eliminated, or moved before or after other steps for additional embodiments of the method. It is also noted that the method 700 is exemplary, and is not intended to limit the present disclosure beyond what is explicitly recited in the claims that follow. The method 700 will be further described below in conjunction with FIGS. 3A-3C, 4, and 8A-8G.

Referring to FIGS. 7A and 8A, the method 700 begins at block 702 where a substrate 802, used to fabricate a semiconductor device 800, is provided. In various embodiments, the substrate 802 is a semiconductor wafer, such as a silicon wafer. Additionally, in some embodiments, the substrate 802 may include various layers, including conductive or insulating layers formed on a semiconductor substrate. The substrate 802 may further include various doping configurations depending on design requirements as is known in the art. The substrate 802 may also include other semiconductors such as germanium, silicon carbide (SiC), silicon germanium (SiGe), or diamond. Alternatively, the substrate 802 may include a compound semiconductor and/or an alloy semiconductor. Further, the substrate 802 may optionally include an epitaxial layer (epi-layer), may be strained for performance enhancement, may include a silicon-on-insulator (SOI) structure, and/or have other suitable enhancement features. Also shown in FIG. 8A, the device 800 further includes a BARC layer 804 formed over the substrate 802 as the bottom layer of a tri-layer lithographic stack. In an embodiment, the BARC layer 804 is formed using a spin-coating process such as illustrated in FIG. 3A, followed by a baking process.

Referring to FIGS. 3A, 7A and 8B, the method 700 proceeds to block 704 where a silicon-containing material 310 is dispensed over the BARC layer 504 to form a silicon-containing material layer 806. In an embodiment, the dispensing of the silicon-containing material 310 is performed using a spin-coating process such as illustrated in FIG. 3A. To further this embodiment, the silicon-containing material 310 may be delivered through a delivery apparatus 316 including a pipeline 318 and dispensed onto the device 800 through a nozzle 312 (FIG. 3A). By way of example, the device 800 including the substrate 802 and the BARC layer 804 is secured on a substrate stage, such as the substrate stage 302, and spun at a certain speed while the silicon-containing material 310 is dispensed. A thickness of the silicon-containing material layer 806 may be controlled by the spin speed, the dispensing flow rate, the dispensing time, and other factors. In an embodiment, block 704 further includes collecting chemical waste derived from the silicon-containing material 310 into a collection apparatus 330 which includes a collection cup 332 and a drain 334 (FIG. 3A). It is noted that in an embodiment of block 704, the dispensed silicon-containing material 310 may also be dispensed onto surfaces of the delivery apparatus 316, the waste collection apparatus 330, and/or other surfaces of the system 300, thereby forming a hardened layer of silicon-containing material 310 upon such surfaces. As described in more detail below, a cleaning solution (e.g., the cleaning solution 324) may be used to remove such hardened layers of silicon-containing material 310 from any of a plurality of surfaces of the system 300. The method 700 proceeds to block 706 where after the silicon-containing material layer 806 has been formed over the BARC layer 804, the device 800 is moved to other processing units for further processes. This will be discussed in more detail below with respect to FIG. 7B.

The method 700 proceeds to block 708 where a cleaning solution is provided. In an embodiment, the provided cleaning solution is the cleaning solution 324 described above which is formed by mixing a basic chemical compound with a solvent, such as an organic solvent. In an embodiment, the basic chemical compound is TMAH and the solvent includes a solution of solvent and water. In some embodiments, the solvent includes a solution of PGEE and water having a PGEE/water ratio of about 90/10, 95/5, 97/3, 99/1, or any ratio in between these values. In some embodiments, other solvents such as PGME, PGMEA, OK73, or others known in the art, may be used. In various embodiments, regardless of the solvent used, the water concentration in the solvent/water solution is at least 5%. In some embodiments, the basic chemical compound of the cleaning solution includes a 0.24% by weight TMAH solution, a 0.07% by weight TMAH solution, or a 0.02% by weight TMAH solution. In some embodiments, the basic chemical compound includes a 0.20% by weight (or greater) TMAH solution. In addition, various other chemicals, such as surfactants and/or additives, may be added to adjust the pH value and viscosity of the cleaning solution. Other embodiments of the cleaning solution are possible, as discussed above.

The method 700 proceeds to block 710 where the delivery apparatus (e.g., the delivery apparatus 316) and the waste collection apparatus (e.g., the waste collection apparatus 330) are cleaned by dispensing the cleaning solution onto surfaces of the delivery apparatus and the waste collection apparatus. In some embodiments, this includes actuating the three-way valve 328 such that a flow of the silicon-containing material 310 is switched off and such that a flow of the cleaning solution 324 is switched on, as illustrated in FIG. 3B. Alternatively, in some embodiments, this includes replacing a container 314 that holds the silicon-containing material 310 with a container 322 that holds the cleaning solution 324 as shown in FIG. 4. In various embodiments, the cleaning solution 324 may be introduced into the delivery apparatus 316 via a pressurized gas, a pump, or other mechanism.

In a further embodiment of block 710, elements of the waste collection apparatus, such as the collection cup 332 and the drain 334 are cleaned. In an embodiment, the waste collection apparatus 330 may be cleaned by directly spraying, or otherwise dispensing, the cleaning solution 324 thereon, as illustrated in FIG. 3C. The basic cleaning solution 324, having a high pH value (e.g., greater than about 10), destabilizes the Si—O bonds of the silicon-containing material, thereby effectively removing solidified particles of the silicon-containing material off of the surfaces of the delivery apparatus 316, the waste collection apparatus 330, and various other components of the system 300.

Returning to blocks 704/706, after the silicon-containing material layer 806 has been formed over the BARC layer 804 (block 704), the device 800 is moved to other processing units for further processing (block 706). Some embodiments of this further processing are described now with FIG. 7B. In particular, FIG. 7B shows a portion of the method 700 which describes further processing of the device 800 and more applications of the cleaning solution 324. In some embodiments, and with reference to FIGS. 7B and 8B, after the silicon-containing material layer 806 has been spin-coated over the BARC layer 804 and the device 800 has been moved for further processing, the method 700 proceeds to block 712 where the substrate 802 including the BARC layer 804 and the silicon-containing material layer 806 is baked. In some embodiments, the baking operation may take place in another processing unit, such as an oven or furnace, separate from the spin-coating system 300. In various embodiments, the baking operation drives solvent out of the silicon-containing material layer 806 and solidifies the material therein, making it a hard mask layer 806 (FIG. 8B) for subsequent etching processes. In some embodiments, drying out of the solvent, for example by the baking process, serves to initiate the cross-linking process described above.

The method 700 proceeds to block 714 where the baked silicon-containing material layer 806 (i.e., the hard mask layer 806) is patterned. In some examples, patterning the hard mask layer 806 includes multiple steps, as illustrated in FIGS. 8C and 8D. Referring to FIG. 8C, in an embodiment of block 714, a resist layer 808 is formed over the hard mask layer 806, the resist layer 808 is exposed to radiation 812 through a mask (or photo-mask or reticle) 810, and the exposed resist layer 808 is developed to form a patterned resist layer. In various embodiments, the resist layer 808 may be a positive resist or a negative resist. A positive resist is normally insoluble in a resist developer, but is made soluble by exposure to the radiation. A negative resist has the opposite behavior. By way of example, the mask 810 may include an IC design layout pattern to be formed on the device 800. The radiation 812 may include deep ultraviolet (DUV) radiation, extreme ultraviolet (EUV) radiation, an electron beam (e-beam), or other suitable radiation. Referring to FIG. 8D, block 714 further includes etching the hard mask layer 806 with the patterned resist layer acting as an etch mask and subsequently removing the patterned resist layer, resulting in a patterned hard mask layer 806A over the BARC layer 804.

Figure 8F:
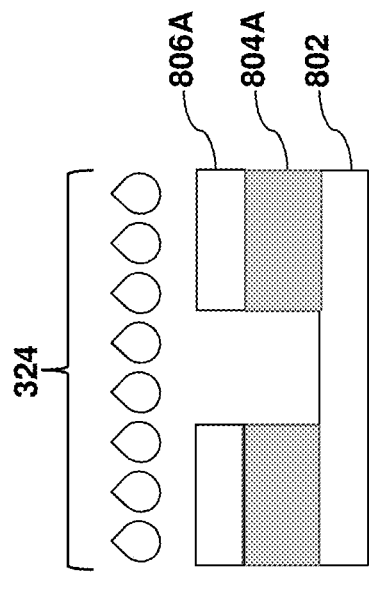
Figure 8E:
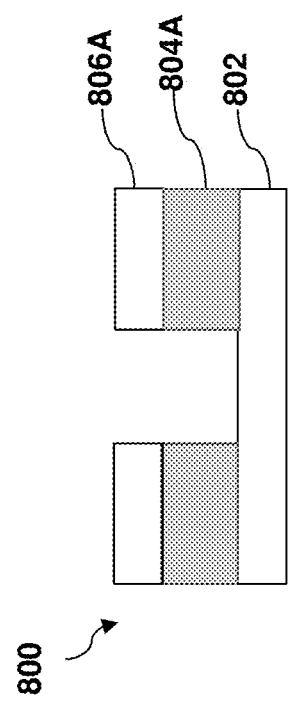

The method 700 proceeds to block 716 where the BARC layer 804 and/or the substrate 802 are etched using the patterned hard mask layer 806A as an etch mask. Referring to FIG. 8E, in an embodiment of block 716, the BARC layer 804 and/or the substrate 802 may be etched using a wet etching process, a dry etching process, or other suitable etching processes. In some embodiments, an anisotropic dry etching process may be used to etch the BARC layer 804 (e.g., to form a patterned BARC layer 804A) and/or the substrate 802 to minimize dimension variations in pattern transfer from the patterned hard mask layer 806A to the underlying layers.

The method 700 proceeds to block 718 where a cleaning solution is provided. In various embodiments, the provided cleaning solution is the cleaning solution 324 described above which is formed by mixing a basic chemical compound with a solvent, such as an organic solvent. In some embodiments, the provided cleaning solution is the cleaning solution described above with reference to block 708. Other embodiments of the cleaning solution are possible, as discussed above.

Figure 8G:
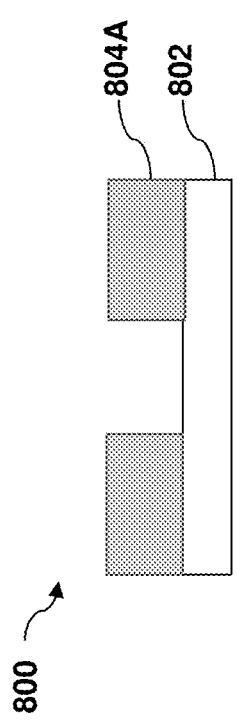

The method 700 proceeds to block 720 where the patterned hard mask layer 806A is removed with the cleaning solution 324. In the embodiment as shown in FIG. 8F, the cleaning solution 324 is applied to the device 800 in a wet etching process. Due to various properties discussed above, the cleaning solution 324 is effective in removing the patterned hard mask layer 806A from the substrate 802 (FIG. 8G). Alternatively, in some embodiments, the patterned hard mask layer 806A may be removed using a dry etching process.

As discussed above, additional steps may also be provided before, during, and after the method 700, and some steps described can be replaced, eliminated, or moved before or after other steps for additional embodiments of the method. For example, in some embodiments, just the delivery apparatus and the waste collection apparatus are cleaned using the cleaning solution, while cleaning the substrate using the cleaning solution (e.g., removing the hard mask layer) is omitted. Alternatively, in some embodiments, the substrate is cleaned using the cleaning solution (i.e., the hard mask layer is removed), while cleaning the spin-coating system (e.g., the delivery apparatus and the waste collection apparatus) using the cleaning solution is omitted. In some examples, both the spin-coating system and the substrate are cleaned using the cleaning solution. In some cases, any semiconductor processing equipment that stores, delivers, or otherwise comes in contact with a silicon-containing material may be cleaned by an embodiment of the cleaning solution described herein. Those of ordinary skill in the art will recognize other embodiments and applications of the cleaning solution, without departing from the scope of the present disclosure.

The embodiments of the present disclosure offer advantages over existing art, though it is understood that other embodiments may offer different advantages, not all advantages are necessarily discussed herein, and that no particular advantage is required for all embodiments. By the disclosed cleaning solution composition and the methods of applying the same, the semiconductor spin-coating system can be cleaned effectively. Particularly, various apparatuses handling silicon-containing resist materials can be cleaned without being taken out of the spin-coating system. In addition, spin-coating delivery apparatuses and waste collection apparatuses can be cleaned with the disclosed cleaning solution so that they may avoid becoming clogged. A clean spin-coating system also reduces a potential for contamination of wafers by particles of the silicon-containing resist material. Those of skill in the art will readily appreciate that the methods and cleaning compositions described herein may be applied to a variety of other semiconductor devices and semiconductor processes to advantageously achieve similar benefits to those described herein without departing from the scope of the present disclosure.

Thus, one of the embodiments of the present disclosure described a method for fabricating a semiconductor device including coating a surface, which may include a surface of a spin-coating system or a surface of a semiconductor substrate, with a silicon-containing material layer having a first pH value. In various embodiments, a cleaning solution is provided to clean the coated surface, where the cleaning solution includes a basic chemical compound mixed with a solvent solution. In some examples, the cleaning solution has a second pH value greater than the first pH value, and the silicon-containing material layer is unstable at the second pH value. In some embodiments, the cleaning solution is applied to the coated surface, and the cleaning solution dissolves the silicon-containing material layer from the coated surface.

In another of the embodiments, discussed is a method for fabricating a semiconductor device including securing a substrate on a substrate stage. In some embodiments, while spinning the substrate stage and the substrate secured thereon, a silicon-containing material is dispensed on the substrate, where the dispensing also dispenses the silicon-containing material onto a surface of a spin-coating system and forms a silicon-containing material layer on the surface of the spin-coating system. In various embodiments, after forming the silicon-containing material layer, a cleaning solution is dispensed onto the silicon-containing material layer, where the cleaning solution includes a basic chemical compound mixed with a solvent solution, and where the cleaning solution has a pH value at which the silicon-containing material layer is unstable. In various examples, responsive to dispensing the cleaning solution onto the silicon-containing material layer, the silicon-containing material layer is removed from the surface of the spin-coating system.

In yet other embodiments, discussed is a method including providing a substrate including a first layer disposed over the substrate. In some embodiments, a second layer is formed over the first layer, where the second layer includes a silicon-containing material layer having a silicon concentration greater than about 10%. In various examples, the substrate including the first and second layers is baked, where the baked second layer forms a hard mask layer. In some embodiments, the hard mask layer is patterned and the first layer is etched using the patterned hard mask layer. In some examples, a cleaning solution is dispensed onto the hard mask layer, where the cleaning solution includes a basic chemical compound mixed with a solvent solution, and where the cleaning solution has a pH value at which the hard mask layer is unstable. In various cases, responsive to dispensing the cleaning solution onto the hard mask layer, the hard mask layer is dissolved.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of semiconductor device fabrication, comprising:
    coating a surface with a silicon-containing material layer having a first pH value;
    providing a cleaning solution to clean the coated surface, wherein the cleaning solution includes a basic chemical compound mixed with a solvent solution, wherein the cleaning solution has a second pH value greater than the first pH value, and wherein the silicon-containing material layer is unstable at the second pH value; and applying the cleaning solution to the coated surface, wherein the cleaning solution dissolves the silicon-containing material layer from the coated surface, thereby removing the silicon-containing layer from the surface.

2. The method of claim 1, wherein the surface includes a surface of a spin-coating system.

3. The method of claim 2, wherein the surface includes at least one of a surface of a delivery apparatus of the spin-coating system and a waste collection apparatus of the spin-coating system.

4. The method of claim 1, wherein the surface includes a surface of a semiconductor substrate.

5. The method of claim 1, wherein the second pH value is greater than about 10.

6. The method of claim 1, wherein the basic chemical compound includes tetramethylammonium hydroxide (TMAH).

7. The method of claim 6, wherein the basic chemical compound has a percent by weight of at least about 0.2% of TMAH.

8. The method of claim 1, wherein the solvent solution includes a solution of water and at least one of propylene glycol ethyl ether (PGEE), propylene glycol monomethylether (PGME), and propylene glycol monomethylether acetate (PGMEA).

9. The method of claim 8, wherein a water concentration of the solvent solution is at least five percent.

10. A method of semiconductor device fabrication, comprising:
securing a substrate on a substrate stage;
while spinning the substrate stage and the substrate secured thereon, dispensing a silicon-containing material on the substrate and onto a surface of a spin-coating system, wherein the dispensing forms a silicon-containing material layer on the substrate and on the surface of the spin-coating system;
after forming the silicon-containing material layer, dispensing a cleaning solution onto the silicon-containing material layer, wherein the cleaning solution includes a basic chemical compound mixed with a solvent solution, wherein the cleaning solution has a pH value at which the silicon-containing material layer is unstable; and
responsive to dispensing the cleaning solution onto the silicon-containing material layer, removing the silicon-containing material layer from the substrate and from the surface of the spin-coating system.

11. The method of claim 10, wherein the surface of the spin-coating system includes at least one of a surface of a pipeline of a delivery apparatus and a surface of a nozzle of the delivery apparatus.

12. The method of claim 10, wherein the surface of the spin-coating system includes a surface of a waste collection apparatus.

13. The method of claim 10, wherein the pH value of the cleaning solution is greater than about 10.

14. The method of claim 10, wherein the basic chemical compound includes tetramethylammonium hydroxide (TMAH), and wherein the basic chemical compound has a percent by weight of at least about 0.2% of TMAH.

15. The method of claim 10, wherein the solvent solution includes a solution of water and at least one of propylene glycol ethyl ether (PGEE), propylene glycol monomethylether (PGME), and propylene glycol monomethylether acetate (PGMEA).

16. The method of claim 10, wherein the cleaning solution has a concentration of hydroxide ions ($OH^-$) in a range of between about 0.01% and about 10%.

17. A method, comprising:
providing a substrate including a first layer disposed over the substrate;
forming a second layer over the first layer, wherein the second layer includes a silicon-containing material layer having a silicon concentration greater than about 10%;
baking the substrate including the first and second layers, wherein the baked second layer forms a hard mask layer;
patterning the hard mask layer and etching the first layer using the patterned hard mask layer;
dispensing a cleaning solution onto the hard mask layer, wherein the cleaning solution includes a basic chemical compound mixed with a solvent solution, wherein the cleaning solution has a pH value at which the hard mask layer is unstable; and
responsive to dispensing the cleaning solution onto the hard mask layer, dissolving the hard mask layer, wherein the dissolving removes the hard mask layer.

18. The method of claim 17, wherein the pH value of the cleaning solution is greater than about 10.

19. The method of claim 17, wherein the basic chemical compound includes tetramethylammonium hydroxide (TMAH), and wherein the basic chemical compound has a percent by weight of at least about 0.2% of TMAH.

20. The method of claim 17, wherein the solvent solution includes a solution of water and at least one of propylene glycol ethyl ether (PGEE), propylene glycol monomethylether (PG-ME), and propylene glycol monomethylether acetate (PGMEA), and wherein a water concentration of the solvent solution is at least five percent.

* * * * *